United States Patent
Bhutani et al.

(10) Patent No.: US 6,820,048 B1
(45) Date of Patent: **\*Nov. 16, 2004**

(54) 4 POINT DERATING SCHEME FOR PROPAGATION DELAY AND SETUP/HOLD TIME COMPUTATION

(75) Inventors: Sandeep Bhutani, Towson, MD (US); Subramanian Venkateswaran, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/515,376

(22) Filed: Feb. 29, 2000

(51) Int. Cl.[7] .............................................. G06F 17/50
(52) U.S. Cl. ........................................ 703/15; 716/6
(58) Field of Search ............................. 703/15, 19, 2, 703/23; 716/6, 4, 18; 702/79; 713/503

(56) References Cited

U.S. PATENT DOCUMENTS

| | | | | |
|---|---|---|---|---|
| 5,274,568 A | * | 12/1993 | Blinne et al. ............... | 364/489 |
| 5,692,160 A | * | 11/1997 | Sarin ........................... | 395/500 |
| 5,802,349 A | * | 9/1998 | Rigg et al. ................... | 395/500 |
| 5,896,299 A | * | 4/1999 | Ginetti et al. ................ | 364/490 |
| 6,028,995 A | * | 2/2000 | Jetton et al. .............. | 395/500.4 |
| 6,038,384 A | * | 3/2000 | Ehrler .................... | 395/500.07 |
| 6,090,152 A | * | 7/2000 | Hayes et al. ................... | 716/6 |
| 6,484,297 B1 | * | 11/2002 | Dixit et al. ..................... | 716/6 |

\* cited by examiner

*Primary Examiner*—Thai Phan
(74) *Attorney, Agent, or Firm*—Mitchell, Silberberg & Knupp LLP

(57) ABSTRACT

Methods for calculating delays for cells in ASICs are disclosed. In the present invention, delays are computed by considering not only the process (P), voltage (V), temperature (T) but also input ramptime (R) and output load or fanout (F) of the cells by fitting the delay at four corner points for derated PVT condition into a non-linear equation which is a function of P, V, T, R and F. Thus, the delay is a five dimensional characterization, and the characterization is split into (P,V,T) characterization and (R,T) characterization to reduce the characterization time and resources. The present invention provides for accurate calculation of delays for cells in ASICs.

22 Claims, 3 Drawing Sheets

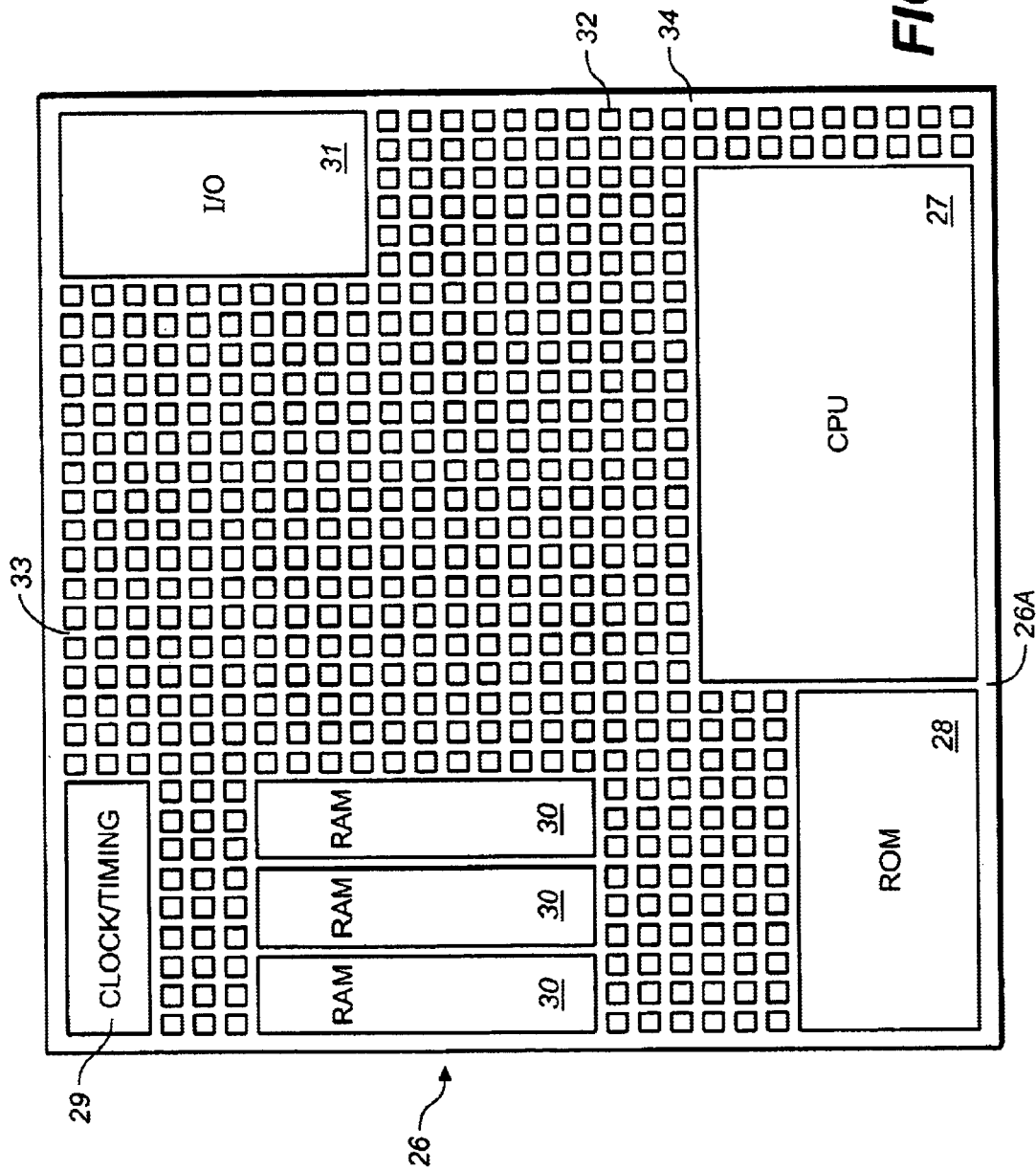
FIG._1

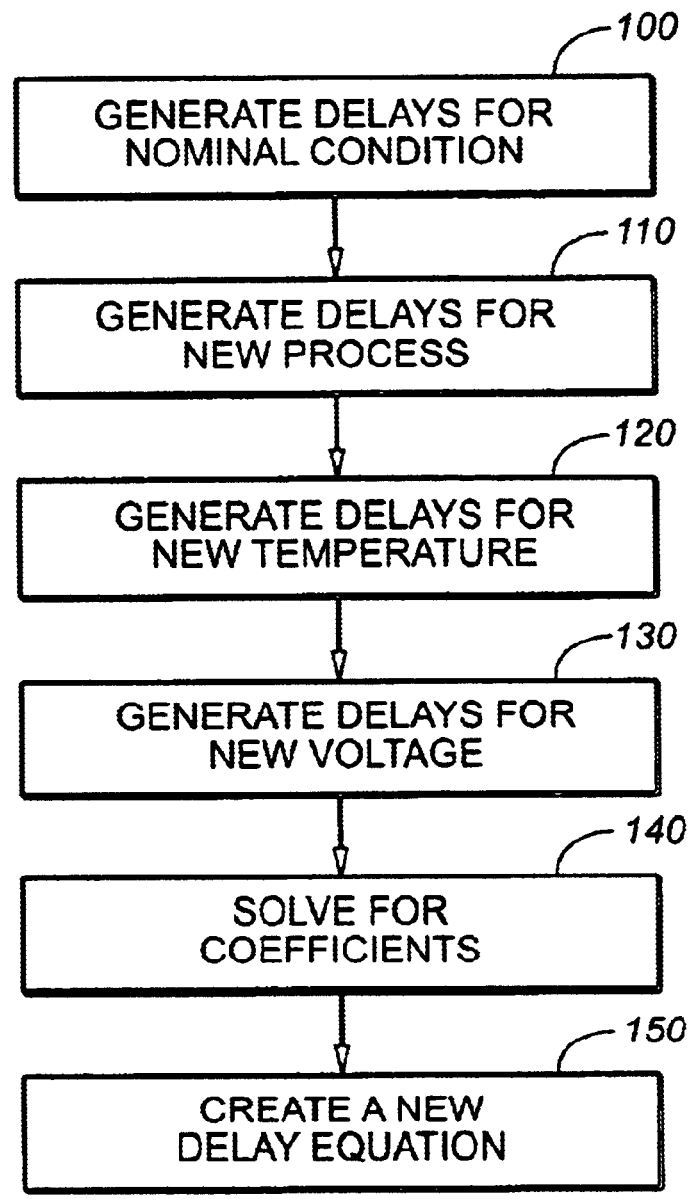
FIG._2

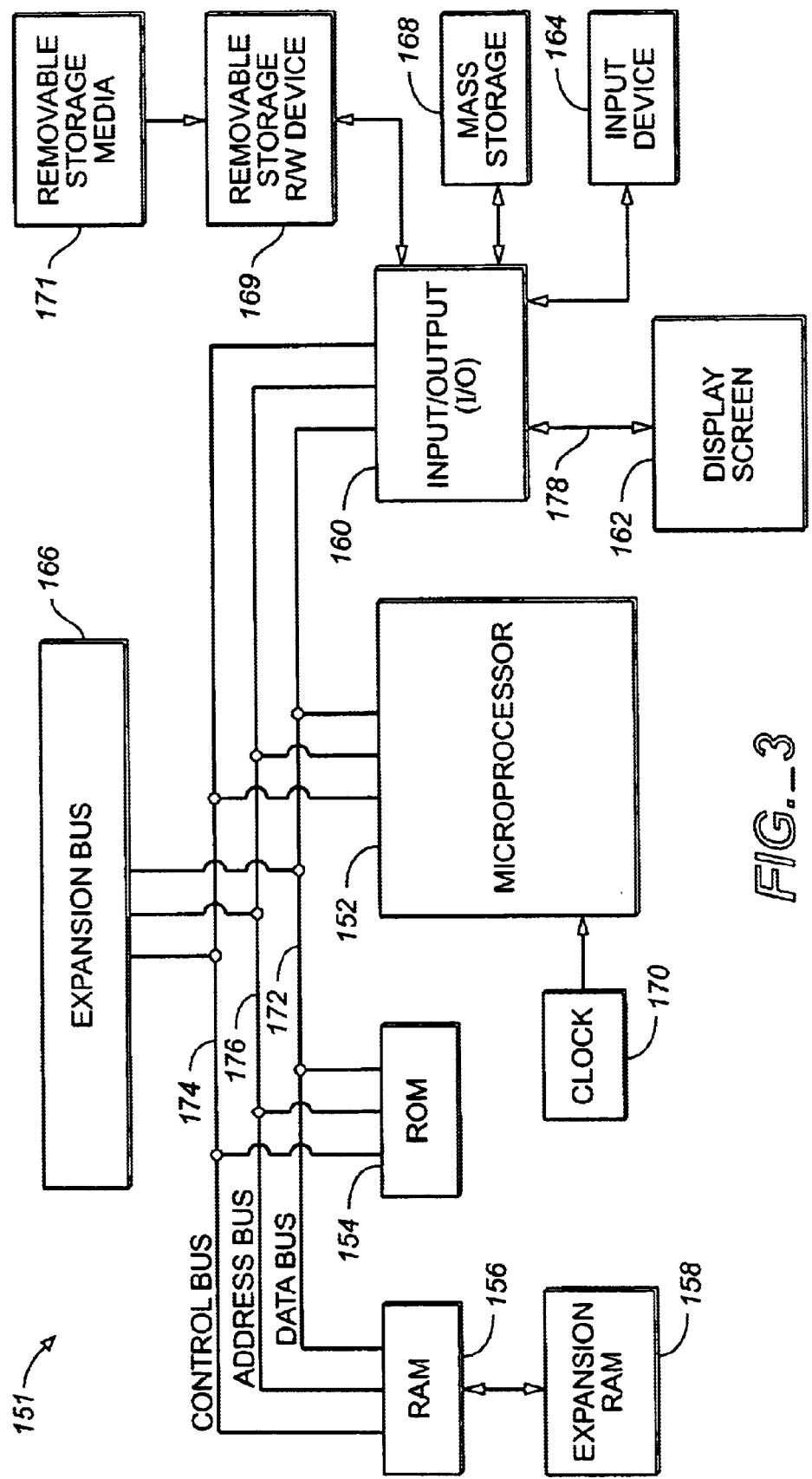
FIG._3

4 POINT DERATING SCHEME FOR PROPAGATION DELAY AND SETUP/HOLD TIME COMPUTATION

BACKGROUND OF THE INVENTION

1. Field of the Invention

The present invention generally relates to the art of microelectronic integrated circuits. In particular, the present invention relates to the art of computing delays for cells in ASICs.

2. Description of the Prior Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

A. IC Configuration.

An exemplary integrated circuit chip is illustrated in FIG. 1 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

B. Layout Design Process.

The input to the physical design problem is a circuit diagram, and the output is the layout of the circuit. This is accomplished in several stages including partitioning, floor planning, placement, routing and compaction.

1. Partitioning.

A chip may contain several million transistors. Layout of the entire circuit cannot be handled due to the limitation of memory space as well as the computation power available. Therefore, the layout is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

2. Floor planning and placement.

This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

3. Routing,

The objective of the routing phase is to complete the interconnections between blocks according to the specified netlist. First, the space not occupied by blocks, which is called the routing space, is partitioned into rectangular regions called channels. The goal of a router is to complete all circuit connections using the shortest possible wire length and using only the channel.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes the exact channel routing of wires.

In order for circuit designers to calculate the performance of ASICs, the designers need to compute the delays of the cells in the ASICs. In the present invention, two types of delays are considered. The first type of delay is the propagation delay of a cell. A propagation delay of a cell is defined as the time duration a signal takes to travel from the input to the output of a cell. The measurement point at the input is called the switching threshold. The measurement point at the output is usually the 0.5*Vdd (the power supply). A propagation delay of a cell is defined for every input to output pin combination of a cell under both the ill rising and falling input conditions. The propagation delay is also affected by a given process (P), voltage (A) and temperature (T).

The second type of delay is the setup/hold time delay which is an input constraint for sequential cells. The setup time is defined as the time duration a data signal is required to be available at the input of a cell before the clock signal transition, and the hold time is defined as the time duration a data signal is required to be stable after the clock signal transition. For the purpose of explanation, both propagation delay and setup/hold time, henceforth, will be referred as 'delay'.

The following derating equation is widely used in the industry to compute the delay of a cell for a given P, V and T of a cell:

$$D_{case} = K * D_{nom} \text{ where,}$$

$D_{nom}$=nominal delay at nominal P, V and T (e.g., P=nominal process, T=room temperature, V=supply voltage);
$D_{case}$=delay for a given P, V and T;
$K=(1+Kp)*((1+Kv\ (V_{case}-V_{nom}))*((1+Kt(T_{case}-T_{nom}));$
$Kp=(D_{case}-D_{nom})/D_{nom};$
$Kv=((D_{case}-D_{nom})/D_{nom})*\Delta,$ where $\Delta=(V_{case}-V_{nom});$
$Kt=((D_{case}-D_{nom})/D_{nom})*\Delta,$ where $\Delta=(T_{case}-T_{nom});$ The equation given above suffers from several problems when the equation is used to calculate delays. First, if $D_{nom}$ equals 0 or is very small, Kp, Kv and Kt approaches infinity, thus, producing an invalid result. Second, the sign of $D_{nom}$ (whether positive or negative) affects the result. For example, if the voltage supplied to a cell is reduced, the delay of the cell is suppose to increase, but if $D_{nom}$ is a negative number and the above equation is used to calculate $D_{case}$ for a lower supply voltage, the calculated delay, $D_{case}$, of the cell decreases instead of increasing, as is the case in the real world. Thus, the sign of $D_{nom}$ may affect the outcome and produce an incorrect result. Third, the above equation is inaccurate because the equation is based on data sampling at a single point and uses linear curve fitting scheme to find the new delay. Fourth, the above equation is not suitable for derating setup and hold times. Finally, the above equation does not capture the dependancy of the delay on the fanout and the input ramptime (defined as the time duration an input signal takes to switch between two logic levels completely) of the cells.

SUMMARY OF THE INVENTION

It is an object of the present invention to provide methods for calculating delays for cells in an ASIC, which obviate for practical purposes the above mentioned limitations.

According to an embodiment of the present invention, the delays, including the propagation delays and the setup/hold time delays, are computed by considering not only the process (P), voltage (V), temperature (T) but also input ramptime (R) and output load or fanout (F) of the cells by fitting the delay at four corner points for derated PVT condition into a non-linear equation which is a function of P, V, T, R and F. Thus, in embodiments of the present invention, the delay characterization is a five dimensional characterization process, and this characterization space is split into (P,V,T) characterization and (R,T) characterization to reduce the characterization time and resources. The present invention provides for accurate calculation of delays for cells in ASICs.

Other features and advantages of the invention will become apparent from the following detailed description, taken in conjunction with the accompanying drawings which illustrate, byway of example, various features of embodiments of the invention.

BRIEF DESCRIPTION OF THE DRAWINGS

FIG. 1 is a simplified illustration of an integrated circuit chip on semiconductor material.

FIG. 2 is a flow chart outlining the method for computing delays of ASIC cells in accordance with embodiments of the present invention.

FIG. 3 is a block diagram of a general-purpose computer system, representing one suitable computer platform for Implementing the methods of the invention.

DESCRIPTION OF THE PREFERRED EMBODIMENTS

In preferred embodiments of the present invention, delays are computed by considering not only the process (P), voltage (V), temperature (T) but also input ramptime (R) and output load or fanout (F) of the cells. Thus, in embodiments of the present invention, the delay is a five dimensional characterization, and the characterization is split into (P,V,T) characterization and (R,F) characterization to reduce the characterization time and resources.

FIG. 2 illustrates a process for computing the delay of an ASIC cell in accordance with embodiments of the present invention. In step 100, data points for delays under the nominal condition (Dnom) for a cell are generated. The present invention generates the delay data points (Dnom) by conducting SPICE simulation on the cell by using the parameters for the nominal condition (i.e., nominal P, V and T) and the transistor level netlist of the cell. However, during the simulation, the input ramptime (R) and the output load (F) of the cell are varied within a respective range. R is varied from Rmin (the minimum value for R) to Rmax (the maximum value for R), and F is varied from Fmin (the minimum value for F) to Fmax (the maximum value for F) while P, V and T remain unchanged at their nominal values.

In certain embodiments of the present invention, approximately sixty values for Dnom are generated by varying the values of R and F However, the following four values for Dnom (Dnom1, Dnom2, Dnom3 and Dnom4) are considered to be most significant in calculating delays for the cell for the purpose of delay derating:

Dnom1=the delay when R=Rmin, F=Fmin;

Dnom2=the delay when R=Rmax, F=Fmin;

Dnom3=the delay when R=Rmin, F=Fmax;

Dnom4=the delay when R=Rmax, F=Fmax;

The values for P, V and T are set at: P=Pnom, V=Vnom, T=Tnom.

In step 110, the value for P is changed from Pnom to another type of process such as WNWP (weak N and weak P) process or SNSP (strong N or strong P) process while V and T remain unchanged. A SPICE simulation is conducted with the new P value. The R and F are varied as described above. The following new delays (Dp1, Dp2, Dp3 and Dp4) are generated with the SPICE simulation:

P=Pnew, Pnew≠Pnom, V=Vnom, T=Tnom;

Dp1=the delay when R=Rmin, F=Fmin;

Dp2=the delay when R=Rmax, F=Fmin;

Dp3=the delay when R=Rmin, F=Fmax;

Dp4=the delay when R=Rmax, F=Fmax.

In step 120, the value for T is changed from Tnom to another temperature value within the operating range of the cell while V and P remain at their nominal values. A SPICE simulation is conducted with the new T value. The R and F are varied as described above. The following new delays (Dt1, Dt2, Dt3 and Dt4) are generated with the SPICE simulation:

P=Pnom, V=Vnom, T=Tnew, Tnew≠Tnom;

Dt1=the delay when R=Rmin, F=Fmin;

Dt2=the delay when R=Rmax, F=Fmin;

Dt3=the delay when R=Rmin, F=Fmax;

Dt4=the delay when R=Rmax, F=Fmax.

In step 130, the value for V is changed from Vnom to another voltage value within the operating range of the cell (e.g., 95% of Vnom or 105% of Vnom) while T and P remain at their nominal values. A SPICE simulation is conducted with the new V value. The R and F are varied as described above. The following new delays (Dv1, Dv2, Dv3 and Dv4) are generated with the SPICE simulation:

P=Pnom, V=Vnew, Vnew≠Vnom, T=Tnom;

Dv1=the delay when R=Rmin, F=Fmin;

Dv2=the delay when R=Rmax, F=Fmin;

Dv3=the delay when R=Rmin, F=Fmax;

Dv4=the delay when R=Rmax, F=Fmax.

In step 140, the following equations are created for the process variation:

$Dp1=Dom1+(m1*R+m2p*F+Ap*R*F+Cp)$; R=Rmin, F=Fmin.

$Dp2=Dnom2+(m1p*R+m2p*F+AP*R*F+CP)$; R=Rmax, F=Fmin.

$Dp3=Dnom2+(m1p*R+m2p*F+Ap*R*F+Cp)$; R=Rmin, F=Fmax.

$Dp4=Dnom4+(m1p*R+m2p*F+Ap*R*F+Cp)$; R=Rmax, F=Fmax.

There are four unknowns in the above equations: m1p, m2p, Ap and Cp. The four unknowns are coefficients. Since there are four unknowns with four equations, the values for m1p, m2p, Ap and Cp can be solved.

Similarly, the following four more equations are created for the temperature variation:

$Dt1=Dnom1+(m1t*R+m2t*F+At*R*F+Ct)$; R=Rmin, F=Fmin.

$Dt2=Dnom2+(m1t*R+m2t*F+At*R*F+Ct)$; R=Rmax, F=Fmin.

$Dt3=Dnom3+(m1t*R+m2t*F+At*R*F+Ct)$; R=Rmin, F=Fmax.

$Dt4=Dnom4+(m1t*R+m2t*F+At*R*F+Ct)$; R=Rmax, F=Fmax.

There are four unknowns in the above equations: m1t, m2t, At and Ct. The four unknowns are coefficients. Since there are four unknowns with four equations, the values for m1t, m2t, At and Ct can be solved.

Similarly, the following four more equations are created for the voltage variation:

$Dv1=Dnom1+(m1v*R+m2v*F+Av*R*F+Cv)$; R=Rmin, F=Fmin.

$Dv2=Dnom2+(m1v*R+m2v*F+Av*R*F+Cv)$; R=Rmax, F=Fmin.

$Dv3=Dnom3+(m1v*R+m2v*F+Av*R*F+Cv)$; R=Rmin, F=Fmax.

$Dv4=Dnom4+(m1v*R+m2v*F+Av*R*F+Cv)$; R=Rmax, F=Fmax.

There are four unknowns in the above equations: m1v, m2v, Av and Cv. The four unknowns are coefficients. Since there are four unknowns with four equations, the values for m1v, m2v, Av and Cv can be solved.

In step 150, after solving for m1p, m2p, Ap, Cp, m1t, m2t, At, Ct, m1v, m2v, Av and Cv, the coefficients are applied to the following equation to solve for any new delays for the cell:

$Dnew=Dnom+(m1p*R+m2p*F+Ap*R*F+Cp)+(m1v*R+m2v*F+Av*R*F+Cv)*(Vnew-Vnom)+(m1t*R+m2t*F+At*R*F+Ct)*(Tnew-Tnom)$.

A new delay can be solved for any given new P, V, T, R and F by using the above equation. The value for Dnom may be retrieved from a table which has various values for Dnom at various R and F.

Generally, the methods described herein with respect to IC design will be practiced with a general purpose computer, either with a single processor or multiple processors. The methods described herein will also be generally implemented in an ECAD system running on a general purpose computer. FIG. 3 is block diagram of a general purpose computer system, representing one of many suitable computer platforms for implementing the methods described above. FIG. 3 shows a general purpose computer system 151 in accordance with the present invention. As shown in FIG. 3, computer system 151 includes a central processing unit (CPU) 152, read-only memory (ROM) 154, random access memory (RAM) 156, expansion RAM 158, input/output (I/O) circuitry 160, display assembly 162, input device 164, and expansion bus 166. Computer system 151 may also optionally include a mass storage unit 168 such as a disk drive unit or nonvolatile memory such as flash memory and a real-time clock 170.

CPU 152 is coupled to ROM 154 by a data bus 172, control bus 174, and address bus 176. ROM 154 contains the basic operating system for the computer system 151. CPU 152 is also connected to RAM 156 by busses 172,174, and 176. Expansion RAM 158 is optionally coupled to RAM 156 for use by CPU 152. CPU 152 is also coupled to the I/O circuitry 160 by data bus 172, control bus 174, and address bus 176 to permit data transfers with peripheral devices.

I/O circuitry 160 typically includes a number of latches, registers and direct memory access (DMA) controllers. The purpose of I/O circuitry 160 is to provide an interface between CPU 152 and such peripheral devices as display assembly 162, input device 164, and mass storage 168.

Display assembly 162 of computer system 151 is an output device coupled to I/O circuitry 160 by a data bus 178. Display assembly 162 receives data from I/O circuitry 160 via bus 178 and displays that data on a suitable screen.

The screen for display assembly 162 can be a device that uses a cathode-ray tube (CRT), liquid crystal display (LCD), or the like, of the types commercially available from a variety of manufacturers. Input device 164 can be a keyboard, a mouse, a stylus working in cooperation with a position-sensing display, or the like. The aforementioned input devices are available from a variety of vendors and are well known in the art.

Some type of mass storage 168 is generally considered desirable. However, mass storage 168 can be eliminated by providing a sufficient mount of RAM 156 and expansion RAM 158 to store user application programs and data. In that case, RAMs 156 and 158 can optionally be provided with a backup battery to prevent the loss of data even when computer system 151 is turned off. However, it is generally desirable to have some type of long term mass storage 168 such as a commercially available hard disk drive, nonvolatile memory such as flash memory, battery backed RAM, PC-data cards, or the like.

A removable storage read/write device 169 may be coupled to I/O circuitry 160 to read from and to write to a removable storage media 171. Removable storage media 171 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 151 by typing on a keyboard, manipulating a mouse or trackball, or "writing" on a tablet or on position-sensing screen of display assembly 162. CPU 152 then processes the data under control of an operating system and an application program, such as a program to perform steps of the inventive method described above, stored in ROM 154 and/or RAM 116. CPU 152 then typically produces data which is output to the display assembly 162 to produce appropriate images on its screen.

Expansion bus 166 is coupled to data bus 172, control bus 174, and address bus 176. Expansion bus 166 provides extra ports to couple devices such as network interface circuits, modems, display switches, microphones, speakers, etc. to CPU 152. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regarding the exemplary embodiments and drawings thereof, it should be apparent to those skilled in the art that various adaptations and modifications of the present invention may be accomplished without departing from the spirit and scope of the invention. Accordingly, the invention is not limited to the precise embodiment shown in the drawings and described in detail hereinabove.

What is claimed is:

1. A method of computing delays of a cell in an integrated circuit, the method comprising the steps of:

(a) generating a first set of the delays of a cell by assigning nominal values to parameters of the cell, said parameters including: a process, supply voltage, temperature, input ramptime and output load;

(b) generating a second set of the delays of the cell by varying values assigned to the parameters of the cell;

(c) creating a delay equation based on the first set and second set of the delays; and (d) computing the delays of the cell by using the delay equation, wherein the delay equation characterizes the delays in terms of the parameters of the cell.

2. The method of claim 1, wherein step (a) comprises setting the process to a nominal process, the supply voltage to a nominal voltage and the temperature to a nominal temperature.

3. The method of claim 2, wherein step (a) further comprises varying the input ramptime and the output load during the generation of the first set of the delays.

4. The method of claim 3, wherein the input ramptime is varied from a minimum allowable input ramptime to a maximum allowable input ramptime.

5. The method of claim 4, wherein the output load is varied from a minimum allowable output load to a maximum allowable output load.

6. The method of claim 1, wherein step (b) comprises varying the process to a non-nominal process.

7. The method of claim 6, wherein step (b) further comprises varying the supply voltage to a non-nominal supply voltage.

8. The method of claim 7, wherein step (b) further comprises varying the temperature to a non-nominal temperature.

9. The method of claim 8, wherein the input ramptime is varied from a minimum allowable input ramptime to a maximum allowable input ramptime.

10. The method of claim 9, wherein the output load is varied from a minimum allowable output load to a maximum allowable output load.

11. The method of claim 1, further comprising the step of generating a set of coefficients related to the process, the supply voltage and the temperature based on the first and second set of the delays.

12. The method of claim 11, wherein step (c) comprises the step of inserting the set of coefficients into the delay equation.

13. A method of computing delays of a cell in an integrated circuit, the method comprising the steps of:
generating a first set of the delays of the cell in a first simulation by using nominal values for a process, supply voltage and temperature of the cell;
assigning a time value within a first range to an input ramptime of the cell during the generation of each of the delays in the first set;
assigning a load value within a second range to an output load of the cell during the generation of each of the delays in the first set;
generating a second set of the delays of the cell in a second simulation by using non-nominal values for the process, supply voltage and temperature of the cell;
creating a delay equation based on the first set and second set of the delays; and
computing the delays of the cell by using the delay equation,
wherein the delay equation characterizes the delays in terms of the process, supply voltage, temperature, input ramptime and output load of the cell.

14. The method of claim 13, further comprising the steps of:
assigning the time value within the first range to the input ramptime of the cell during the generation of each of the delays in the second set; and
assigning the load value within the second range to the output load of the cell during the generation of each of the delays in the second set.

15. The method of claim 14, further comprising the step of generating a set of coefficients related to the process, the supply voltage and the temperature based on the first and second set of the delays.

16. The method of claim 15, further comprising the step of inserting the set of coefficients into the delay equation.

17. An apparatus for computing delays of a cell in an integrated circuit, said apparatus comprising:
a processor for executing stored program instruction steps; and
a memory connected to the processor for storing the program instruction steps,
wherein the cell has parameters including a process, supply voltage, temperature, input ramptime and output load, and the program instruction steps include:
generating a first set of the delays of the cell by assigning nominal values to the parameters;
generating a second set of the delays of the cell by varying values assigned to the parameters of the cell;
creating a delay equation based on the first set and second set of the delays; and
computing the delays of the cell by using the delay equation,
wherein the delay equation characterizes the delays in terms of the parameters of the cell.

18. An ECAD system for computing delays of a cell in an integrated circuit, said system comprising:
means for generating a first set of the delays of the cell by assigning nominal values to parameters of the cell, said parameters including: a process, supply voltage, temperature, input ramptime and output load;
means for generating a second set of the delays of the cell by varying values assigned to the parameters of the cell;
means for creating a delay equation based on the first set and second set of the delays; and
means for computing the delays of the cell by using the delay equation,
wherein the delay equation characterizes the delays in terms of the parameters of the cell.

19. An apparatus for computing delays of a cell in an integrated circuit, said apparatus comprising:
a processor for executing stored program instruction steps; and
a memory connected to the processor for storing the program instruction steps,
wherein the program instruction steps include:
generating a first set of the delays of the cell in a first simulation by using nominal values for a process, supply voltage and temperature of the cell;
assigning a time value within a first range to an input ramptime of the cell during the generation of each of the delays in the first set;
assigning a load value within a second range to an output load of the cell during the generation of each of the delays in the first set;
generating a second set of the delays of the cell in a second simulation by using non-nominal values for the process, supply voltage and temperature of the cell;
creating a delay equation based on the first set and second set of the delays; and
computing the delays of the cell by using the delay equation,
wherein the delay equation characterizes the delays in terms of the process, supply voltage, temperature, input ramptime and output load of the cell.

20. The apparatus of claim 19, wherein the program instruction steps further include the steps of:
assigning the time value within the first range to the input ramptime of the cell during the generation of each of the delays in the second set; and
assigning the load value within the second range to the output load of the cell during the generation of each of the delays in the second set.

21. The apparatus of claim 20, wherein the program instruction steps further include the step of generating a set of coefficients related to the process, the supply voltage and the temperature based on the first and second set of the delays.

22. The apparatus of claim 21, wherein the program instruction steps further include the step of inserting the set of coefficients into the delay equation.

* * * * *